United States Patent [19]

Duo et al.

[11] Patent Number: 4,906,849

[45] Date of Patent: Mar. 6, 1990

[54] LASER RADIATION DETECTOR USING POLYVINYLIDENE FLUORIDE FILM

[75] Inventors: Wang S. Duo; Fan L. Zao, both of Beijing, China

[73] Assignee: Institute of Physics, Chinese Academy of Sciences Chinese Academy of Sciences Transducer Co., Ltd., China

[21] Appl. No.: 86,411

[22] Filed: Aug. 17, 1987

[30] Foreign Application Priority Data

Oct. 10, 1986 [CN] China .................................. 86207853

[51] Int. Cl.$^4$ .............................................. G01J 5/02
[52] U.S. Cl. ................................................ 250/338.3
[58] Field of Search ......................... 250/338.3, 211 R

[56] References Cited

U.S. PATENT DOCUMENTS 3,772,518  11/1973  Murayama et al. ............. 250/211 R
4,467,202   8/1984  Nakamura et al. .............. 250/338.3
4,547,456  10/1985  Kojima et al. .................... 346/135.1

OTHER PUBLICATIONS

Blevin et al., "Infrared Reflectometry with a Cavity—Shaped Pyroelectric Detector", App. Phys. 13, 10, Oct. 1974, 2212–2217.

Primary Examiner—Carolyn E. Fields
Attorney, Agent, or Firm—Townsend and Townsend

[57] ABSTRACT

The present invention is a pyroelectric radiation detector using a polyvinylidene fluoride film (PVDF) as the sensitive material and having graphite in contact with one side of the film. The detector can have a planar or a conical cavity configuration. The sensitivity of this detector is in the range of 5 to 10 V/J, and the response time is shorter than 0.5 ms. This detector can be used to directly detect pulse laser radiation within a spectral range of 0.25 $\mu$m to 25 $\mu$m and having a power density as high as 100 MW/cm$^2$. The detector is also suitable for other light radiations ranging from violet to infrared wavelength. It can be used, for example, as an infrared detector, as a radiation sensor for measuring temperature, as a detector for a standard radiation meter, and as a light trap for the equivalent black body absorption.

6 Claims, 1 Drawing Sheet

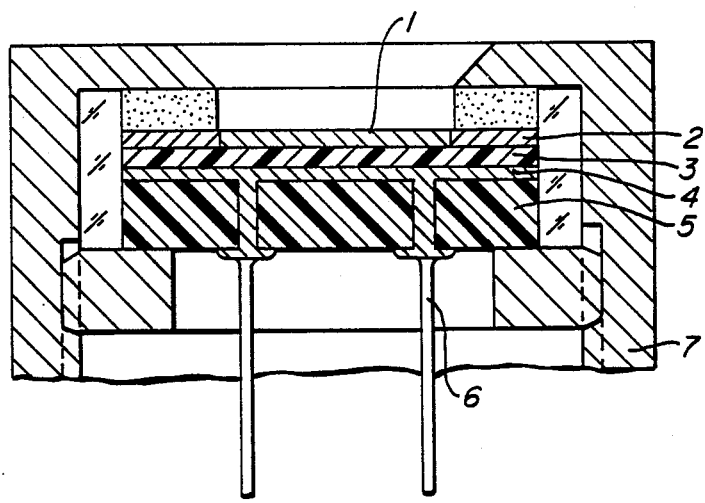
FIG._1.
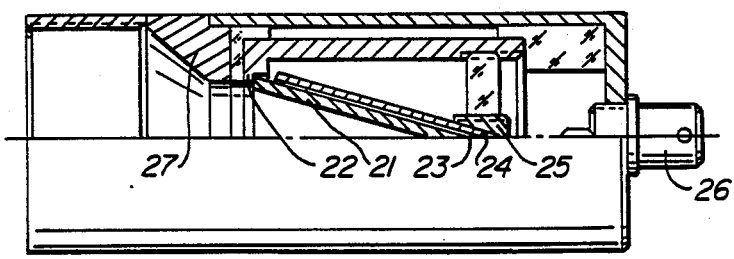
FIG._2.

LASER RADIATION DETECTOR USING POLYVINYLIDENE FLUORIDE FILM

BACKGROUND OF THE INVENTION

The present invention relates to a laser radiation detector, and in particular to a pyroelectric detector which not only has a wide spectral response, but also can directly withstand pulse laser radiation with a high power density.

In known pyroelectric detectors the radiation absorbing layer of wide spectral response is gold black which is prepared by vacuum deposition. The maximum radiation power density which such detectors can withstand is thus only 1 MW/cm$^2$. When a pyroelectric material made of single crystal ferroelectrics is used as the temperature sensitive material, the detector can only be fabricated in the shape of a disk. Such disks are limited in size by the single crystal material, and their cost is high. Other types of detectors include cavity-type detectors which use temperature sensitive elements such as thermocouples as the sensor. Such detectors are lacking, however, in sensitivity and response speed.

SUMMARY OF THE INVENTION

As object of the present invention is to provide a pyroelectric detector having a high sensitivity and quick response and one which is able to directly withstand pulse laser radiation at a high power density.

Another object of the present invention is to provide a detector comprised of a combination of a specially made thin slice or a cavity-type absorbing body for absorbing radiation and a polymer film used as temperature sensitive material. Such a detector has the advantages of simple manufacture and low cost.

A further object of the present invention is to provide a detector having a flatter response characteristic within a spectral range of 0.25 $\mu$m to 27 $\mu$m.

According to the present invention, a pyroelectric detector is provided which comprises a temperature sensitive element made of polymer material having a pyroelectric effect; an absorbing body with a specific shape, made of graphite and closely contacted with the temperature sensitive element; an electrode in electrical contact with one side of the absorbing body; another electrode leading out from another side of the temperature sensitive element; and a metal housing shielding the whole detector.

The absorbing body of the detector of the present invention is made in such a way that carbon atoms produced by splitting a hydrocarbon under high temperature, subatmospheric pressure, and a nitrogen atmosphere, are directionally deposited on and consequentially separated from the wall of a prepared mold. An example of a polymer material having the pyroelectric property is a polarized polyvinylidene fluoride (referred to as PVDF hereinafter) film, which may be polarized as follows: the film is stretched at a temperature in the range of 100° C. to 150° C., and cooled in a strong electric field intensity ranging over 300 KV/cm to 1 MV/cm. The polarized PVDF film is capable of maintaining a permanent pyroelectric effect, and its pyroelectric coefficient compared to that of the single crystal of lithium niobate. The combined structure of the absorbing body prepared in the aforementioned way and the polarized pyroelectric material provides the detector with the ability to withstand high power density radiation while maintaining high sensitivity, quick response, and wide spectral range. Such a detector can also be made into a cavity-type pyroelectric detector which has the advantages of a simple manufacturing process and low cost.

BRIEF DESCRIPTION OF THE DRAWINGS

FIG. 1 is a schematic diagram of one embodiment of a pyroelectric detector according to the present invention with a planar configuration.

FIG. 2 is a schematic diagram of another embodiment of a pyroelectric detector according to the present invention, this time with a conical cavity configuration.

DETAILED DESCRIPTION OF THE INVENTION AND PREFERRED EMBODIMENTS

Referring now to FIGS. 1 and 2:

FIG. 1 shows the planar configuration of a pyroelectric detector according to the present invention. The absorbing body of the detector may be a thin planar plate of circular, square, or other shape, an area in the range of 2 mm$^2$ to 36 cm$^2$, and a thickness from 50 $\mu$m to 200 $\mu$m. In FIG. 1, reference numeral (1) indicates an absorbing layer of a specially made black body for receiving radiation. The absorbing layer has a diameter of 20 mm, a thickness of 100 $\mu$m, and, on its periphery, a copper ring (2) having a diameter of 25 mm, acting as the grounding electrode. Both the black absorbing layer (1) and the copper ring (2) are adhered to the PVDF film (3), behind which, there is a gold (or silver) plated layer (4) acting as another electrode. This conductive layer (4) is plated on a substrate (5) made of a copper coated board. Lead wires (6) are led out from the other side of the substrate (5) through metallized holes. The detector chip is shielded by a grounded metal housing (7).

According to the planar configuration of the pyroelectric detector of the present invention as shown in FIG. 1, the polarized PVDF film is first cut along a line distant 4–10 mm from the periphery of the absorbing body when the absorbing body is superimposed on the polarized PVDF film. Then the polarized PVDF cut is uniformly flattened and is adhered to the copper coated board plated with gold (or silver) by use of an electrically conductive silver paste. Next, the planar surface of the absorbing body is bonded to the polarized PVDF film. An electrically conductive stripe-shaped metal frame having a width from 2 mm to 5 mm is closely contacted with the peripheral portion of the upper surface of the absorbing body to form the grounding electrode. The copper coated board having been gold plated acts as another electrode, and the PVDF film is located between the two electrodes.

FIG. 2 shows a conical cavity configuration of a pyroelectric detector according to the present invention. The caliber, vertex angle, and thickness of the wall of the absorbing body range from 5 mm to 60 mm, 22.5° C. to 60° C., and 150 $\mu$m to 300 $\mu$m, respectively. In FIG. 2, reference numeral (21) indicates a conical cavity-type absorbing body. The caliber of the conical cavity is 20 mm, and the front edge of the conical cavity is well contacted with a copper ring (22) which is used as the grounding electrode. On the back surface of the conical cavity, there is a PVDF film (23) which closely wraps around the conical cavity. On the outer surface of the PVDF film, there is a silver-plated layer (24) which acts an another electrode. The layer (24) is in electrical contact with the electrode base (25). The signal is emitted through a coaxial socket (26). The whole conical cavity detector is shielded by a grounded metal housing 27.

According to the conical cavity configuration of the pyroelectric detector of the present invention as shown in FIG. 2, the polarized PVDF film is first cut into a segment of a sufficient size to be wrapped around the conical cavity. Then the segment is closely adhered to the outer wall of the conical cavity. The PVDF film used here must have a silver film plated on its outer surface. The conical cavity itself becomes the grounding electrode, and the silver film plated on the outer surface of the PVDF film forms another electrode.

It must be assured that there is no short circuit to occur between two surfaces of the PVDF film during the fabrication of the two pyroelectric detectors having the configurations provided in the present invention.

Detectors with these two configurations give excellent performance, and have the advantages of quick response of the pyroelectric material, wide spectral absorption and the ability to withstand high power density radiation by the absorbing body. Detectors according to the present invention can be used for detecting the pulse laser outputs from the YAG (yttrium aluminum garnet) laser and its double and triple frequencies, the $CO_2$ laser, and the ruby laser, and can also be used for detecting the outputs of continuous laser chopped from the tungsten ribbon lamp, He-Ne laser, $CO_2$ laser, etc.

Typical data for pyroelectric radiation detectors having the planar plate (and conical cavity) configurations provided in the present invention are:

| | |
|---|---|
| Effective aperture for light measurement | 2 cm$^2$ |
| Thickness of absorbing body | 150 $\mu$m |
| Thickness of polyvinylidene fluoride film | 30 $\mu$m |
| Spectral range | 0.25-25 $\mu$m |
| Sensitivity | 20 mV/mJ(0.5 V/J) |
| Response time | 0.5 msec |
| Maximum endurable power density | 100 MW/cm$^2$ (500 MW/cm$^2$) |

The data in the parentheses relate to the conical cavity configuration.

The structure, technology, and use of the present invention have been described in detail in conjunction with the preferred embodiments. Those skilled in the art will recognize that still other improvements and modifications may be made while still falling within the principles and scope of the present invention. For example, the detector may be made in a spherical configuration, and the configuration shown in FIG. 1 may also be used for the detection of the types of radiation such as infrared, as a radiation sensor for measuring temperature, etc. and as a multifunction sensor. The configuration shown in FIG. 2 may also be used as the detector of a standard radiation meter, or the light trap of the equivalent black body absorption and so on. All this and other embodiments are considered to be within the field and scope of the present invention as defined in the appended claims.

What is claimed is:

1. A pyroelectric radiation detector comprising:
   a temperature sensitive element made of a polymer material having a pyroelectric effect;
   an absorbing body made of graphite, well thermally and electrically contacted with said temperature sensitive element;
   an electrode well electrically contacted with said absorbing body;
   another electrode well electrically contacted with the other side of said temperature sensitive element; and
   a metal housing shielding the whole said detector;
   said temperature sensitive element having the form of a plate having first and second opposing surfaces, with both said first and second surfaces fully covered by said absorbing body and said electrodes.

2. A pyroelectric radiation detector as defined in claim 1, wherein said polymer material having a pyroelectric effect is a polarized polyvinylidene fluoride (PVDF) film.

3. A pyroelectric radiation detector as defined in claim 2, wherein said absorbing body made of graphite is a directionally deposited graphite layer.

4. A pyroelectric radiation detector comprising:
   a temperature sensitive element made of a polarized polyvinylidene fluoride film having first and second surfaces;
   a directionally deposited graphite layer, well thermally and electrically contacted with said temperature sensitive element, said graphite layer having first and second sides and having a configuration of a planar plate having an area in the range of 2 mm$^2$ to 36 cm$^2$, and a thickness in the range of 50 to 200 $\mu$m, said polarized polyvinylidene film having an area larger than said graphite layer;
   a first electrode comprised of a stripe-shaped metal frame well electrically contacted with said graphite layer on said first side thereof;
   a second electrode comprised of a copper-coated board plated with gold or silver well electrically contacted with said graphite layer on said second side thereof; and
   a metal housing shielding the whole said detector.

5. A pyroelectric radiation detector comprising:
   a temperature sensitive element made of a polarized polyvinylidene fluoride film having first and second surfaces;
   a directionally deposited graphite layer, well thermally and electrically contacted with said temperature sensitive element, said graphite layer having first and second sides and having a configuration of a conical cavity having a calibre, vertex angle, and wall thickness ranging from 5 to 60 mm, 22.5° to 60°, and 150 to 300 $\mu$m, respectively, said polarized polyvinylidene film being coextensive with the outer surface of said conical cavity;
   a first electrode comprised of a metal ring well electrically contacted with said graphite layer on said first side thereof;
   a second electrode comprised of a silver film well electrically contacted with said graphite layer on said second side thereof; and
   a metal housing shielding the whole said detector.

6. A pyroelectric radiation detector as defined in claims 4 or 5, wherein said first electrode is a grounding electrode connected with said shielding metal housing.

* * * * *